United States Patent
Yaguchi et al.

(10) Patent No.: US 8,883,652 B2
(45) Date of Patent: Nov. 11, 2014

(54) SILICON ETCHING LIQUID AND ETCHING METHOD

(75) Inventors: Kazuyoshi Yaguchi, Tokyo (JP); Ryuji Sotoaka, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 609 days.

(21) Appl. No.: 12/681,247

(22) PCT Filed: Sep. 22, 2008

(86) PCT No.: PCT/JP2008/067106
§ 371 (c)(1),
(2), (4) Date: Apr. 1, 2010

(87) PCT Pub. No.: WO2009/044647
PCT Pub. Date: Apr. 9, 2009

(65) Prior Publication Data
US 2010/0248495 A1    Sep. 30, 2010

(30) Foreign Application Priority Data

Oct. 4, 2007  (JP) .................. 2007-260827

(51) Int. Cl.
*H01L 21/306* (2006.01)
*C09K 13/00* (2006.01)
*B81C 1/00* (2006.01)

(52) U.S. Cl.
CPC ...... *H01L 21/30608* (2013.01); *B81C 1/00539* (2013.01)
USPC ................... 438/745; 252/79.1; 257/E21.219

(58) Field of Classification Search
CPC ...................... H01L 21/30608; B81C 1/00539
USPC ................... 438/745; 252/79.1; 257/E21.219
See application file for complete search history.

(56) References Cited

U.S. PATENT DOCUMENTS

2006/0293208 A1 *  12/2006  Egbe et al. .................... 510/407

OTHER PUBLICATIONS

U.S. Appl. No. 13/508,475, filed May 7, 2012, Sotoaka, et al.

* cited by examiner

*Primary Examiner* — Duy Deo
*Assistant Examiner* — Mahmoud Dahimene
(74) *Attorney, Agent, or Firm* — Oblon, Spivak, McClelland, Maier & Neustadt, L.L.P.

(57) ABSTRACT

A silicon etching liquid characterized by anisotropically dissolving monocrystalline silicon therein by using an aqueous solution containing a quaternary ammonium hydroxide and an aminoguanidine salt and an etching method of silicon using the instant etching liquid are an etching liquid and an etching method enabling one to perform processing at a high etching rate in etching processing of silicon, particularly in etching processing of silicon in a manufacturing process of MEMS parts or semiconductor devices.

9 Claims, No Drawings

SILICON ETCHING LIQUID AND ETCHING METHOD

This application is a 371 of PCT/JP2008/067106 filed Sep. 22, 2008. Priority to Japanese patent application 2007-260827, filed Oct. 4, 2007, is claimed.

TECHNICAL FIELD

The present invention relates to etching processing of silicon. In particular, the present invention relates to a silicon etching liquid and a silicon etching method to be used for manufacturing MEMS (microelectromechanical systems) parts or semiconductor devices.

BACKGROUND ART

Hitherto, in the case where a silicon single crystal substrate is etched with a chemical solution, there are a method of performing etching with an acid based etching liquid which is a mixed aqueous solution having components such as hydrofluoric acid and nitric acid, etc. added thereto; a method of performing etching with an alkali based etching liquid which is an aqueous solution of potassium hydroxide, tetramethylammonium hydroxide, etc.; and so on (see Non-Patent Documents 1 and 2).

In the case where an acid based etching liquid is used, the surface of silicon is oxidized with a component having an oxidizing action, such as nitric acid, etc., to form silicon oxide, and this silicon oxide is dissolved as silicon fluoride by hydrofluoric acid, etc., whereby etching proceeds. A characteristic feature in performing etching with an acid based etching liquid resides in the matter that even when silicon which is an etching object is monocrystalline, polycrystalline or amorphous, the etching isotropically proceeds. For that reason, in performing pattern etching using a pattern mask, etc., there may be the case where the deeper the etching is, the more the etching in a lateral direction, namely undercut (erosion) beneath the pattern mask proceeds to the same degree as the depth, resulting in causing inconvenience.

On the other hand, in the case where an alkali based etching liquid is used, silicon is dissolved as an ion of silicic acid by a hydroxy anion in the liquid, and on that occasion, water is reduced to generate hydrogen. When etching with the alkali based etching liquid is performed, different from the case of the acid based etching liquid, etching of monocrystalline silicon proceeds while keeping anisotropy. This is based on the matter that there is a difference in a dissolution rate of silicon in every crystal face orientation of silicon, and this etching is also called crystal anisotropic etching. Even in polycrystalline silicon, etching proceeds while keeping anisotropy on microscopic observations. However, in view of the fact that the face orientation of crystal grains is randomly distributed, isotropic etching appears to proceed on macroscopic observations. In amorphous silicon, etching isotropically proceeds on both of microscopic observations and macroscopic observations. As one kind of the alkali based etching liquid, there is one in which not only a difference in a dissolution rate in every crystal face orientation is utilized, but the dissolution selectivity is revealed in, as an object, a monocrystalline silicon substrate having a p-type dopant locally implanted therein depending upon the presence or absence of the dopant, and there is proposed a method of performing etching with enhanced anisotropy by the addition of an alcohol, a phenol, etc. to an alkaline aqueous solution (see Patent Document 1).

The alkaline compound to be dissolved in the alkaline etching liquid can be roughly classified into an inorganic alkaline compound such as NaOH, KOH, etc. and an organic alkaline compound such as tetramethylammonium hydroxide, choline, etc.

In the case where an inorganic alkaline aqueous solution is compared with an organic alkaline aqueous solution, in general, the inorganic alkaline aqueous solution is able to achieve a high silicon etching rate, an aspect of which, however, relies upon a condition such as concentration, temperature, etc. For that reason, in the case where it is intended to perform etching of silicon at a high etching rate, an inorganic alkaline aqueous solution is frequently used. On the contrary, in the case where there is a concern that functions of an electric device part or an electric wiring part existing on a silicon substrate in which an Na ion or a K ion is an etching object, or on other silicon substrate to be manufactured using the same equipment are influenced, an organic alkaline aqueous solution such as tetramethylammonium hydroxide (TMAH), etc. is frequently used (see Non-Patent Document 3).

Also, besides the etching application of silicon, TMAH is a compound which is generally used in the field of electronic materials, in particular, the field of cleaning solvents, etc. For example, Patent Document 2 discloses the use of a cleaning agent composed of TMAH and a guanidine salt as a water-soluble detergent for removing contaminants (resists and dry etching residues, etc.) adhered to a substrate such as silicon, a metal, an interlayer dielectric material, etc. without etching the substrate itself; however, this patent document is quite different from the present invention which is aimed to perform etching of silicon itself.

[Patent Document 1] JP-A-6-188236
[Patent Document 2] JP-A-2007-16232
[Non-Patent Document 1] Sato, "Silicon Etching Technologies" in *Journal of the Surface Finishing Society of Japan*, Vol. 51, No. 8, 2000, pages 754 to 759
[Non-Patent Document 2] Esashi, 2003 *MEMS Technology Outlook*, pages 109 to 114
[Non-Patent Document 3] Tabata, "Silicon. Crystal Anisotropic Etching Using TMAH Solution" in *Journal of the Surface Finishing Society of Japan*, Vol. 51, No. 8, 2000, pages 767 to 772

DISCLOSURE OF THE INVENTION

Problems that the Invention is to Solve

In the case where an aqueous solution of a quaternary ammonium hydroxide such as TMAH, etc. is used as an etching liquid, undesirable influences against functions of an electric device part or an electric wiring part by an Na ion or a K ion can be avoided; whereas an etching rate is low, there was involved a problem that a time required for performing etching processing becomes long.

Then, an object of the present invention is to provide an etching liquid and an etching method capable of shortening a time required for performing etching processing by enhancing an etching rate of an aqueous solution containing a quaternary ammonium hydroxide.

Means for Solving the Problems

In order to solve the foregoing problems, the present inventors made extensive and intensive investigations. As a result, it has been found that a high etching rate against silicon can be attained by performing etching with an aqueous solution containing a quaternary ammonium hydroxide and an aminoguanidine salt, leading to accomplishment of the present invention. That is, the present invention is concerned with a silicon etching liquid comprising an aqueous solution containing a quaternary ammonium hydroxide and an aminoguanidine salt and an etching method. The present invention is as follows.

1. A silicon etching liquid for anisotropically dissolving monocrystalline silicon therein, comprising an aqueous solution containing (1) a quaternary ammonium hydroxide and (2) an aminoguanidine salt.
2. The silicon etching liquid as set forth above in 1, wherein the quaternary ammonium hydroxide (1) is tetramethylammonium hydroxide.
3. The silicon etching liquid as set forth above in 1, wherein the aminoguanidine salt (2) is one or more members selected among aminoguanidine bicarbonate, aminoguanidine sulfate, aminoguanidine hydrochloride and aminoguanidine nitrate.
4. The silicon etching liquid as set forth above in 1, wherein a concentration of the quaternary ammonium hydroxide (1) is from 3 to 30% by mass, and a concentration of the aminoguanidine salt (2) is from 1 to 20% by mass.
5. The silicon etching liquid as set forth above in 1, wherein a pH is 11 or more.
6. A silicon etching method including a step of immersing an etching object with the silicon etching liquid asset forth above in 1.
7. The silicon etching method as set forth above in 6, wherein the aminoguanidine salt (2) is one or more members selected among aminoguanidine bicarbonate, aminoguanidine sulfate, aminoguanidine hydrochloride and aminoguanidine nitrate.

Advantages of the Invention

In the light of the above, according to the present invention, it becomes possible to perform etching of silicon at a high etching rate while avoiding undesirable influences against functions of an electric device part or an electric wiring part by an Na ion or a K ion. For that reason, there is brought an effect for enabling one to make a time required for etching processing shorter than that of the conventional technologies by enhancing an etching rate as compared with that in conventional etching with a quaternary ammonium hydroxide aqueous solution.

BEST MODES FOR CARRYING OUT THE INVENTION

As the quaternary ammonium hydroxide which is used in the present invention, tetramethylammonium hydroxide, tetraethylammonium hydroxide or tetrabutylammonium hydroxide is preferable, and tetramethylammonium hydroxide is especially preferable. The quaternary ammonium hydroxide of the present invention may be used in combinations of two or more kinds thereof.

A concentration of the quaternary ammonium hydroxide can be properly determined depending upon a desired silicon etching rate, and the quaternary ammonium hydroxide is preferably used in the concentration range of from 3 to 30% by mass. The concentration of the quaternary ammonium hydroxide is more preferably from 5 to 29% by mass, and further preferably from 8 to 26% by mass. In the concentration range of lower than 3% by mass, there may be the case where a large amount of pyramidal fine projections are formed on the surface of the etched face, thereby finally giving undesirable influences against the appearance and functions of a product. Also, in a concentration of higher than 30% by mass, it cannot be contrived to enhance an etching rate obtained by adding an aminoguanidine salt.

Even within the concentration rage of from 3 to 30% by mass, there may be the case where pyramidal fine projections are formed in dependence on the environment for treatment or the concentration of impurities of silicon to be etched itself. In such projections, the number of formed projections tends to become small on the high concentration side within the foregoing concentration range; and therefore, in the case where it is intended to make the formation of projections small, it is preferable to use the quaternary ammonium hydroxide in a region on the high concentration side, for example, from 10 to 30% by mass.

On the contrary, in the case where the formation of some projections is not problematic from the process standpoint, it is possible to use the quaternary ammonium hydroxide in a region on the low concentration side where a relatively high etching rate is obtained within the range of from 3 to 30% by mass, for example, from 3 to 10% by mass.

In this way, it is possible to properly determine the concentration of the quaternary ammonium hydroxide within the range of from 3 to 30% by mass.

In the present invention, an aminoguanidine salt is used together with the quaternary ammonium hydroxide. More specifically, the aminoguanidine salt is aminoguanidine bicarbonate, aminoguanidine sulfate, aminoguanidine hydrochloride or aminoguanidine nitrate. The aminoguanidine salt may be used singly or in combinations of two or more kinds thereof.

A concentration of the aminoguanidine salt can be properly determined depending upon a desired silicon etching rate, and the aminoguanidine salt is preferably used in the concentration range of from 1 to 20% by mass. The concentration of the aminoguanidine salt is more preferably from 5 to 20% by mass, and further preferably from 10 to 19% by mass. In the concentration range of lower than 1% by mass, there may be the case where an effect for enhancing the silicon etching rate due to the addition of the aminoguanidine salt is not distinctly obtained. When the concentration of the aminoguanidine salt is 1% by mass or more, an effect for enhancing the etching rate of silicon due to the addition of the aminoguanidine salt is distinctly obtained; and in increasing the concentration of the aminoguanidine salt, following this, the etching rate is liable to be enhanced, too. However, even when the concentration of the aminoguanidine salt is increased exceeding 20% by mass, an effect for more enhancing the etching rate is not brought. Since there may be the case where the solubility of each of the quaternary ammonium hydroxide and the aminoguanidine salt is insufficient depending upon the temperature of the etching liquid, taking into consideration a desired etching rate, the concentration of each of the quaternary ammonium hydroxide and the aminoguanidine salt may be regulated.

Also, for the purpose of enhancing wettability, a surfactant may be added to the etching liquid of the present invention, and for example, any of cationic, nonionic or anionic surfactants may be used. Furthermore; general additives such as a coloring agent, etc. can be added. The etching liquid of the present invention is preferably alkaline so as to have a pH of higher than 7. The pH is more preferably 9 or higher, and further preferably 11 or higher.

In the silicon etching method of the present invention, in general, a method in which an etching object is immersed in the warmed etching liquid; and after a lapse of a prescribed time, the etching object is taken out and rinsed with water, etc. for the purpose of removing the etching liquid adhered to the etching object from the etching object, followed by drying is carried out. A use temperature of the etching liquid is preferably a temperature of 40° C. or higher and lower than a boiling point thereof, more preferably from 50° C. to 90° C., and especially preferably from 70° C. to 90° C. In the case where the temperature of the etching liquid is lower than 40° C., the etching rate becomes low so that the production efficiency is remarkably lowered. When the temperature is increased to the boiling point, a change of the liquid composition is remarkable so that it is difficult to keep the etching condition on a fixed level. By making the temperature of the etching liquid high, the etching rate increases. However, taking into consideration suppression of variability with time of the performance of the etching liquid on a small level or the like, it would be better to properly determine an optimal treatment temperature.

The etching object in the present invention is a monocrystalline silicon-containing substrate or polyhedral block, and the monocrystalline silicon is present in an entire region or partial region of the substrate or block. The monocrystalline silicon may be laminated in a single-layered or multi-layered state. A material obtained by subjecting an entire region or partial region of such a substrate or block to ion doping is also the etching object. Also, those in which a material such as a silicon oxide film, a silicon nitride film, a silicon organic film, etc. or a metal film such as an aluminum film, a chromium film, a gold film, etc. is present on the surface of the foregoing etching object or in the inside of the object are included in the etching object in the present invention.

EXAMPLES

The present invention is more specifically described below with reference to the following Examples and Comparative Examples, but it should be construed that the present invention is not limited to these Examples at all. The term "%" in the Examples and Comparative Examples means % by mass. The etching object used for the evaluation is a monocrystalline silicon (100) (hereinafter sometimes simply referred to as "silicon (100)") wafer. The surface on one side of this silicon (100) wafer is in a state where its entire surface is covered by a protective film made of a silicon thermal oxide film; and the surface on the other side has a pattern shape in which a part of a silicon thermal oxide film is removed by dry etching, whereby the silicon surface is exposed. This silicon (100) wafer was immersed in a 1% hydrofluoric acid aqueous solution at ordinary temperature for 3 minutes just before an etching treatment and then rinsed with ultra-pure water, followed by drying. A silicon natural oxide film formed on the surface of a portion where the silicon surface in a pattern shape was exposed was removed by this treatment with a hydrofluoric acid aqueous solution, and thereafter, the treatment was carried out.

Example 1

An aqueous solution containing 10% of tetramethylammonium hydroxide and 10% of aminoguanidine bicarbonate was prepared as an etching liquid. This etching liquid was charged in a PTFE-made container, and this container was dipped in a water bath, thereby warming the temperature of the etching liquid to 80° C. After the temperature of the etching liquid reached 80° C., a monocrystalline silicon (100) wafer was subjected to an etching treatment upon being immersed in the etching liquid for 10 minutes; and thereafter, the wafer was taken out, rinsed with ultra-pure water and then dried. In the wafer having been subjected to an etching treatment, following the etching of silicon, the pattern portion became in a hollow state as compared with the surroundings thereof, and a difference of elevation between the etched portion and the non-etched portion was measured, thereby determining an etching depth of the silicon (100) face for 10 minutes. A value obtained by dividing this etching depth by 10 was computed as an etching rate (unit: µm/min) of the silicon (100) face. As a result, the etching rate of the silicon (100) face was found to be 1.56 µm/min.

Example 2

An aqueous solution containing 10% of tetramethylammonium hydroxide and 10% of aminoguanidine sulfate was prepared as an etching liquid, and an etching rate of the silicon (100) face was examined in the same manner as in Example 1. As a result, the etching rate was found to be 1.21 µm/min.

Example 3

An aqueous solution containing 10% of tetramethylammonium hydroxide and 10% of aminoguanidine hydrochloride was prepared as an etching liquid, and an etching rate of the silicon (100) face was examined in the same manner as in Example 1. As a result, the etching rate was found to be 1.09 µm/min.

Example 4

An aqueous solution containing 10 of tetramethylammonium hydroxide and 10% of aminoguanidine nitrate was prepared as an etching liquid, and an etching rate of the silicon (100) face was examined in the same manner as in Example 1. As a result, the etching rate was found to be 1.08 µm/min.

Comparative Example 1

An aqueous solution containing only 10% of tetramethylammonium hydroxide was prepared as an etching liquid, and an etching rate of the silicon (100) face was examined in the same manner as in Example 1. As a result, the etching rate of the silicon (100) face was found to be 0.61 µm/min.

It is noted from Examples 1 to 4 and Comparative Example 1 that when the aminoguanidine salt is added to the aqueous solution of tetramethylammonium hydroxide as an organic alkaline compound, the etching rate of the silicon (100) face is more enhanced than that using the tetramethylammonium hydroxide aqueous solution in the same concentration.

Example 5

An aqueous solution containing 8% of tetramethylammonium hydroxide and 10% of aminoguanidine bicarbonate was prepared as an etching liquid, and an etching rate of the silicon (100) face was examined in the same manner as in Example 1. As a result, the etching rate was found to be 1.43 µm/min.

Comparative Example 2

An aqueous solution containing only 8% of tetramethylammonium hydroxide was prepared as an etching liquid, and an etching rate of the silicon (100) face was examined in the same manner as in Example 1. As a result, the etching rate of the silicon (100) face was found to be 0.73 µm/min.

Example 6

An aqueous solution containing 15% of tetramethylammonium hydroxide and 10% of aminoguanidine bicarbonate was prepared as an etching liquid, and an etching rate of the silicon (100) face was examined in the same manner as in Example 1. As a result, the etching rate was found to be 1.01 μm/min.

Comparative Example 3

An aqueous solution containing only 15% of tetramethylammonium hydroxide was prepared as an etching liquid, and an etching rate of the silicon (100) face was examined in the same manner as in Example 1. As a result, the etching rate of the silicon (100) face was found to be 0.60 μm/min.

Example 7

An aqueous solution containing 25 of tetramethylammonium hydroxide and 10% of aminoguanidine bicarbonate was prepared as an etching liquid, and an etching rate of the silicon (100) face was examined in the same manner as in Example 1. As a result, the etching rate was found to be 0.62 μm/min.

Comparative Example 4

An aqueous solution containing only 25% of tetramethylammonium hydroxide was prepared as an etching liquid, and an etching rate of the silicon (100) face was examined in the same manner as in Example 1. As a result, the etching rate of the silicon (100) face was found to be 0.48 μm/min.

It is noted from Example 1 and Comparative Example 1 and Examples 5, 6 and 7 and Comparative Examples 2, 3 and 4 that in the case where the aminoguanidine salt in a fixed concentration is added to the aqueous solution of tetramethylammonium hydroxide as an organic alkaline compound in a varied concentration, the etching rate of the silicon (100) face is more enhanced than that using the respective tetramethylammonium hydroxide aqueous solution in the same concentration.

Example 8

An aqueous solution containing 20% of tetramethylammonium hydroxide and 5.0% of aminoguanidine bicarbonate was prepared as an etching liquid, and an etching rate of the silicon (100) face was examined in the same manner as in Example 1. As a result, the etching rate was found to be 0.63 μm/min.

Example 9

An aqueous solution containing 20% of tetramethylammonium hydroxide and 10.0% of aminoguanidine bicarbonate was prepared as an etching liquid, and an etching rate of the silicon (100) face was examined in the same manner as in Example 1. As a result, the etching rate was found to be 0.72 μm/min.

Example 10

An aqueous solution containing 20% of tetramethylammonium hydroxide and 12.0% of aminoguanidine bicarbonate was prepared as an etching liquid, and an etching rate of the silicon (100) face was examined in the same manner as in Example 1. As a result, the etching rate was found to be 0.77 μm/min.

Comparative Example 5

An aqueous solution containing only 20% of tetramethylammonium hydroxide was prepared as an etching liquid, and an etching rate of the silicon (100) face was examined in the same manner as in Example 1. As a result, the etching rate was found to be 0.51 μm/min.

It is noted from Examples 8, 9 and 10 and Comparative Example 5 that in the case where the aminoguanidine salt is added to the aqueous solution of tetramethylammonium hydroxide as an organic alkaline compound, the etching rate of the silicone (100) face is enhanced depending upon the addition amount thereof.

The blending ratio of each of the etching liquids prepared in Examples 1 to 10 and Comparative Examples 1 to 0.5 and the etching rate thereof are shown in Table 1.

TABLE 1

|  | Example 1 | Example 2 | Example 3 | Example 4 | Comparative Example 1 | Example 5 | Comparative Example 2 |
|---|---|---|---|---|---|---|---|
| Blending ratio (% by mass) | | | | | | | |
| Tetramethylammonium hydroxide | 10 | 10 | 10 | 10 | 10 | 8 | 8 |
| Aminoguanidine bicarbonate | 10 | | | | | 10 | |
| Aminoguanidine sulfate | | 10 | | | | | |
| Aminoguanidine hydrochloride | | | 10 | | | | |
| Aminoguanidine nitrate | | | | 10 | | | |
| Etching rate (μm/min) | 1.56 | 1.21 | 1.09 | 1.08 | 0.61 | 1.43 | 0.73 |

|  | Example 6 | Comparative Example 3 | Example 7 | Comparative Example 4 | Example 8 | Example 9 | Example 10 | Comparative Example 5 |
|---|---|---|---|---|---|---|---|---|
| Blending ratio (% by mass) | | | | | | | | |
| Tetramethylammonium hydroxide | 15 | 15 | 25 | 25 | 20 | 20 | 20 | 20 |
| Aminoguanidine bicarbonate | 10 | | 10 | | 5 | 10 | 12 | |
| Aminoguanidine sulfate | | | | | | | | |
| Aminoguanidine hydrochloride | | | | | | | | |
| Aminoguanidine nitrate | | | | | | | | |
| Etching rate (μm/min) | 1.01 | 0.60 | 0.62 | 0.48 | 0.63 | 0.72 | 0.77 | 0.51 |

The invention claimed is:

1. A silicon etching method, said method comprising etching an etching object comprising monocrystalline silicon by immersing said object with a silicon etching aqueous solution consisting essentially of:
   (1) a quaternary ammonium hydroxide,
   (2) an aminoguanidine salt, and
   (3) water to anisotropically dissolve said monocrystalline silicon, wherein the aminoguanidine salt (2) is at least one selected from the group consisting of aminoguanidine bicarbonate, aminoguanidine sulfate, animoguanidine hydrochloride and aminoguanidine nitrate.

2. The silicone etching method for anisotropically dissolving monocrystalline silicon according to claim 1, wherein the quaternary ammonium hydroxide (1) is tetramethylammonium hydroxide.

3. The silicone etching method for anistropically dissolving monocrystalline silicon according to claim 1, wherein a concentration of the quaternary ammonium hydroxide (1) is from 3 to 30% by mass, and a concentration of the aminoguanidine salt (2) is from 1 to 20% by mass, based on the total weight of the solution.

4. The silicone etching method for anisotropically dissolving monocrystalline silicon according to claim 1, wherein a pH of the solution is 11 or more.

5. The silicon etching method according to claim 1, wherein the silicon etching aqueous solution consists essentially of:
   (1) tetramethylammonium hydroxide,
   (2) aminoguanidine bicarbonate, and
   (3) water.

6. The silicon etching method according to claim 1, wherein the silicon etching aqueous solution consists essentially of:
   (1) tetramethylammonium hydroxide,
   (2) aminoguanidine sulfate, and
   (3) water.

7. The silicon etching method according to claim 1, wherein the silicon etching aqueous solution consists essentially of:
   (1) tetramethylammonium hydroxide,
   (2) animoguanidine hydrochloride, and
   (3) water.

8. The silicon etching method according to claim 1, wherein the silicon etching aqueous solution consists essentially of:
   (1) tetramethylammonium hydroxide,
   (2) aminoguanidine nitrate, and
   (3) water.

9. The silicon etching method according to claim 1, wherein the temperature of the silicon etching aqueous solution is 40° C.-90° C.

* * * * *